United States Patent
Cekli et al.

(10) Patent No.: US 9,753,377 B2
(45) Date of Patent: Sep. 5, 2017

(54) DEFORMATION PATTERN RECOGNITION METHOD, PATTERN TRANSFERRING METHOD, PROCESSING DEVICE MONITORING METHOD, AND LITHOGRAPHIC APPARATUS

(71) Applicant: ASML Netherlands B.V., Veldhoven (NL)

(72) Inventors: Hakki Ergun Cekli, Eindhoven (NL); Irina Lyulina, Son (NL); Manfred Gawein Tenner, Eindhoven (NL); Richard Johannes Franciscus Van Haren, Waalre (NL); Stefan Cornelis Theodorus Van Der Sanden, Nijmegen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 211 days.

(21) Appl. No.: 14/420,311

(22) PCT Filed: Jun. 27, 2013

(86) PCT No.: PCT/EP2013/063499
§ 371 (c)(1),
(2) Date: Feb. 6, 2015

(87) PCT Pub. No.: WO2014/032833
PCT Pub. Date: Mar. 6, 2014

(65) Prior Publication Data
US 2015/0205213 A1 Jul. 23, 2015

Related U.S. Application Data

(60) Provisional application No. 61/694,665, filed on Aug. 29, 2012.

(51) Int. Cl.
*G03B 27/32* (2006.01)
*G03B 27/74* (2006.01)
(Continued)

(52) U.S. Cl.
CPC ...... *G03F 7/70258* (2013.01); *G03F 7/70483* (2013.01); *G03F 7/70616* (2013.01);
(Continued)

(58) Field of Classification Search
CPC ............ G03F 7/70258; G03F 7/70483; G03F 7/70616; G03F 7/70633; G03F 9/7003; G03F 9/7019
(Continued)

(56) References Cited

U.S. PATENT DOCUMENTS

| | | | | |
|---|---|---|---|---|
| 5,682,243 A | * | 10/1997 | Nishi | G03F 9/70 356/401 |
| 6,064,486 A | * | 5/2000 | Chen | G03F 9/70 356/399 |

(Continued)

FOREIGN PATENT DOCUMENTS

| | | |
|---|---|---|
| EP | 1 477 851 | 11/2004 |
| EP | 1 744 217 | 1/2007 |

(Continued)

OTHER PUBLICATIONS

Japanese Office Action mailed Jan. 13, 2016 in corresponding Japanese Patent Application No, 2015-528914.
(Continued)

*Primary Examiner* — Colin Kreutzer
(74) *Attorney, Agent, or Firm* — Pillsbury Winthrop Shaw Pittman LLP

(57) ABSTRACT

A deformation pattern recognition method including providing one or more deformation patterns, each deformation pattern being associated with a deformation of a substrate
(Continued)

that may be caused by a processing device; transferring a first pattern to a substrate, the first pattern including at least N alignment marks, wherein each alignment mark is positioned at a respective predefined nominal position; processing the substrate; measuring a position of N alignment marks and determining an alignment mark displacement for the N alignment marks by comparing the respective nominal position with the respective measured position; fitting at least one deformation pattern to the measured alignment mark displacements; determining an accuracy value for each fitted deformation pattern, the accuracy value being representative of the accuracy of the corresponding fit; using the determined accuracy value, determining whether an associated deformation pattern is present.

14 Claims, 4 Drawing Sheets

(51) Int. Cl.
  *G03F 7/20* (2006.01)
  *G03F 9/00* (2006.01)
(52) U.S. Cl.
  CPC ........ *G03F 7/70633* (2013.01); *G03F 9/7003* (2013.01); *G03F 9/7019* (2013.01)
(58) Field of Classification Search
  USPC ........................................ 355/67, 68, 72, 77
  See application file for complete search history.

(56) References Cited

U.S. PATENT DOCUMENTS

| | | | |
|---|---|---|---|
| 6,650,955 B1 | 11/2003 | Sonderman et al. | |
| 6,961,116 B2 | 11/2005 | Den Boef et al. | |
| 7,410,735 B2 | 8/2008 | Reuhman-Huisken et al. | |
| 7,468,795 B2 | 12/2008 | Simons et al. | |
| 7,649,614 B2 | 1/2010 | De Mol | |
| 8,208,121 B2 | 6/2012 | Bijnen et al. | |
| 8,796,684 B2 | 8/2014 | Schoumans et al. | |
| 2004/0126004 A1 | 7/2004 | Kikuchi | |
| 2004/0138846 A1 | 7/2004 | Buxton et al. | |
| 2005/0031975 A1 | 2/2005 | Reuhman-Huisken et al. | |
| 2005/0099628 A1 | 5/2005 | Kokumai | |
| 2006/0042753 A1* | 3/2006 | O'Leary | G05B 23/0237 156/345.1 |
| 2006/0279722 A1 | 12/2006 | De Mol | |
| 2007/0021860 A1 | 1/2007 | Simons et al. | |
| 2008/0073589 A1 | 3/2008 | Adel et al. | |
| 2008/0316442 A1 | 12/2008 | Adel et al. | |
| 2010/0323461 A1 | 12/2010 | Schoumans et al. | |
| 2011/0137597 A1 | 6/2011 | McIntyre et al. | |

FOREIGN PATENT DOCUMENTS

| | | |
|---|---|---|
| JP | H07-245261 | 9/1995 |
| JP | H09-306818 | 11/1997 |
| JP | 2002-353121 | 12/2002 |
| JP | 2006-285144 | 10/2006 |
| JP | 2006-344947 | 12/2006 |
| JP | 2011-095742 | 5/2011 |

OTHER PUBLICATIONS

International Preliminary Report on Patentability mailed Mar. 12, 2015 in corresponding International Patent Application No. PCT/EP2013/063499.
Author: Disclosed Anonymously, "Use of historic data to derive a profile equation reference point," Research Disclosure Database No. 547012, 2 pages, Published in Nov. 2009.
International Search Report mailed Feb. 10, 2014 in corresponding International Patent Application No. PCT/EP2013/063499.

* cited by examiner

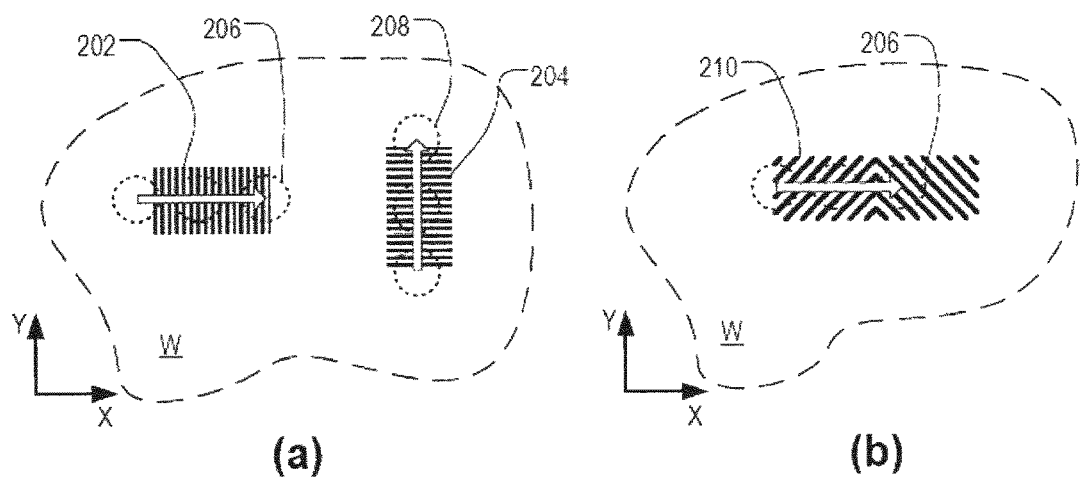
(a) (b)
Fig. 2
FIG. 3
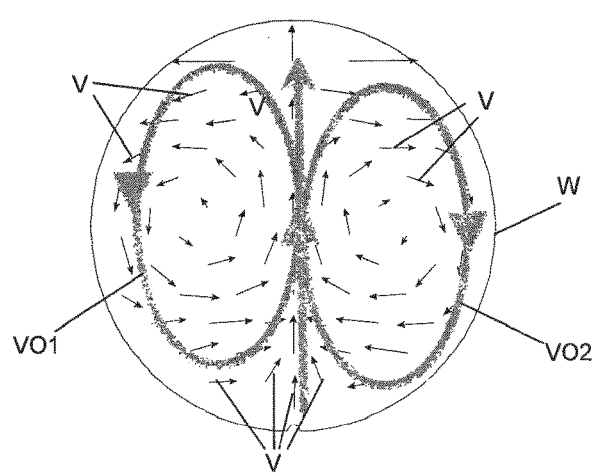

DEFORMATION PATTERN RECOGNITION METHOD, PATTERN TRANSFERRING METHOD, PROCESSING DEVICE MONITORING METHOD, AND LITHOGRAPHIC APPARATUS

CROSS-REFERENCE TO RELATED APPLICATIONS

This application is the U.S. national phase entry of International Patent Application No. PCT/EP2013/063499, filed Jun. 27, 2013, which claims the benefit of priority from U.S. provisional application 61/694,665, which was filed on Aug. 29, 2012, and which is incorporated herein in its entirety by reference.

FIELD

The present invention relates to a method for recognizing a deformation pattern of a substrate, a method for transferring a second pattern relative to a first pattern to a substrate, a method to monitor one or more processing devices, and to a lithographic apparatus arranged to transfer a pattern from a patterning device onto a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When multiple patterns are transferred subsequently to a substrate, it may be desired to align subsequent patterns relative to each other. To align a subsequent pattern to a previously transferred pattern it is desirable to know the location of the previously transferred pattern. In order to determine the location of a pattern on a wafer, alignment marks are transferred to predefined positions on the substrate. By measuring the position of the alignment marks, information can be obtained that can be used to transfer a subsequent pattern relative to the previously transferred pattern to the substrate.

The position information of a previously transferred pattern, which is used to accurately transfer a subsequent pattern relative to the previously transferred pattern, usually does not correspond one to one to the position information obtained from measuring the position of the alignment marks, as not all areas of a pattern can be used to place alignment marks. As a consequence, alignment marks are usually placed at edges of a pattern or in so-called scribe-lanes, while it is important that the center regions of the pattern used to manufacture devices are aligned with respect to each other.

To solve this, a model can be fitted to the measured positions of the alignment marks. This model can be used to determine the position information of a previously transferred pattern that can be used to accurately transfer a subsequent pattern relative to the previously transferred pattern.

In an attempt to more accurately determine the position information of a previously transferred pattern, advanced alignment models, like higher-order alignment models, (extended) zone alignment and grid alignment, are used. However, the success of these models is dependent on the distribution and number of alignment marks.

However, using a large number of alignment marks has a negative impact on the throughput of the lithographic apparatus. Furthermore, the known advanced alignment models may be very sensitive to outliers.

SUMMARY

It is desirable to provide a method to accurately transfer a second pattern with respect to a first pattern.

According to an embodiment of the invention, there is provided a deformation pattern recognition method comprising the following steps:
a) providing one or more deformation patterns, each deformation pattern being associated with a deformation of a substrate that may be caused by one or more processing devices when said substrate is processed in said one or more processing devices;
b) transferring a first pattern to a substrate, said first pattern including at least N alignment marks, wherein each alignment mark is positioned at a respective predefined nominal position in the first pattern;
c) processing the substrate in said one or more processing devices;
d) measuring a position of N alignment marks and determining an alignment mark displacement for each of the N alignment marks from the respective nominal position by comparing the respective nominal position of an alignment mark with the respective measured position of said alignment mark;
e) fitting at least one of the one or more deformation patterns to the measured alignment mark displacements;
f) determining an accuracy value for each fitted deformation pattern, the accuracy value being representative for the accuracy of the corresponding fit;
g) using the determined accuracy value, determining whether an associated deformation pattern is present in the measured alignment mark displacements.

According to a further embodiment of the invention, there is provided a pattern transferring method comprising the following steps:
1) providing a correction recipe for each of the one or more deformation patterns, each correction recipe prescribing how a pattern has to be transferred to a substrate deformed in accordance with the associated deformation pattern in order to compensate for the deformation of the substrate;
2) carrying out the method steps of the deformation pattern recognition method according to the invention to determine which of the one or more deformation patterns are present in the measured alignment mark displacements;

3) transferring a second pattern to the substrate using the correction recipes of the fitted deformation patterns that are present in the measured alignment mark displacements in order to align the second pattern with respect to the first pattern.

According to another embodiment of the invention, there is provided a processing device monitoring method comprising the following steps:

1) carrying out the method steps of the deformation pattern recognition method according to claim 1 to determine which of the one or more deformation patterns is present in the measured alignment mark displacements; and 2) using the obtained accuracy values of the fitted deformation patterns in order to determine whether the corresponding one or more processing devices were used during processing of the substrate and/or were malfunctioning during processing of the substrate.

According to yet another embodiment of the invention, there is provided a lithographic apparatus arranged to transfer a pattern from a patterning device onto a substrate, the apparatus comprising:

a substrate table constructed to hold a substrate;

an alignment sensor for measuring the positions of alignment marks on the substrate relative to a reference;

a control unit to control the transfer onto the substrate by reference to the positions of the alignment marks on the substrate measured by said alignment sensor;

wherein the control unit comprises a storage location for storing at least one deformation pattern which is representative for a deformation of a substrate that may be caused by a processing device when said substrate is processed in said processing device, and wherein the control unit is configured:

to control the lithographic apparatus in order to transfer a first pattern to a substrate, said first pattern including at least N alignment marks, to receive data from the alignment sensor representative for a position of N alignment marks in order to determine an alignment mark displacement for each of the N alignment marks from the respective nominal position by comparing the respective nominal position of an alignment mark with the respective measured position of said alignment mark, each alignment mark displacement being representative for a respective local deformation of the substrate resulting from the processing of the substrate, to fit the at least one deformation pattern to the measured alignment mark displacements, to determine an accuracy value for each fitted deformation pattern, each accuracy value being representative for the accuracy of the corresponding fit, and to use the obtained accuracy values in order to determine whether an associated deformation pattern is present in the measured alignment mark displacements.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2, comprising FIG. 2(a) and FIG. 2(b), illustrates various forms of an alignment mark that may be provided on a substrate in the apparatus of FIG. 1;

FIG. 3 depicts an example of a deformation pattern associated with a deformation of a substrate that may be caused by processing the substrate in one or more processing devices;

DETAILED DESCRIPTION

Figure 1:
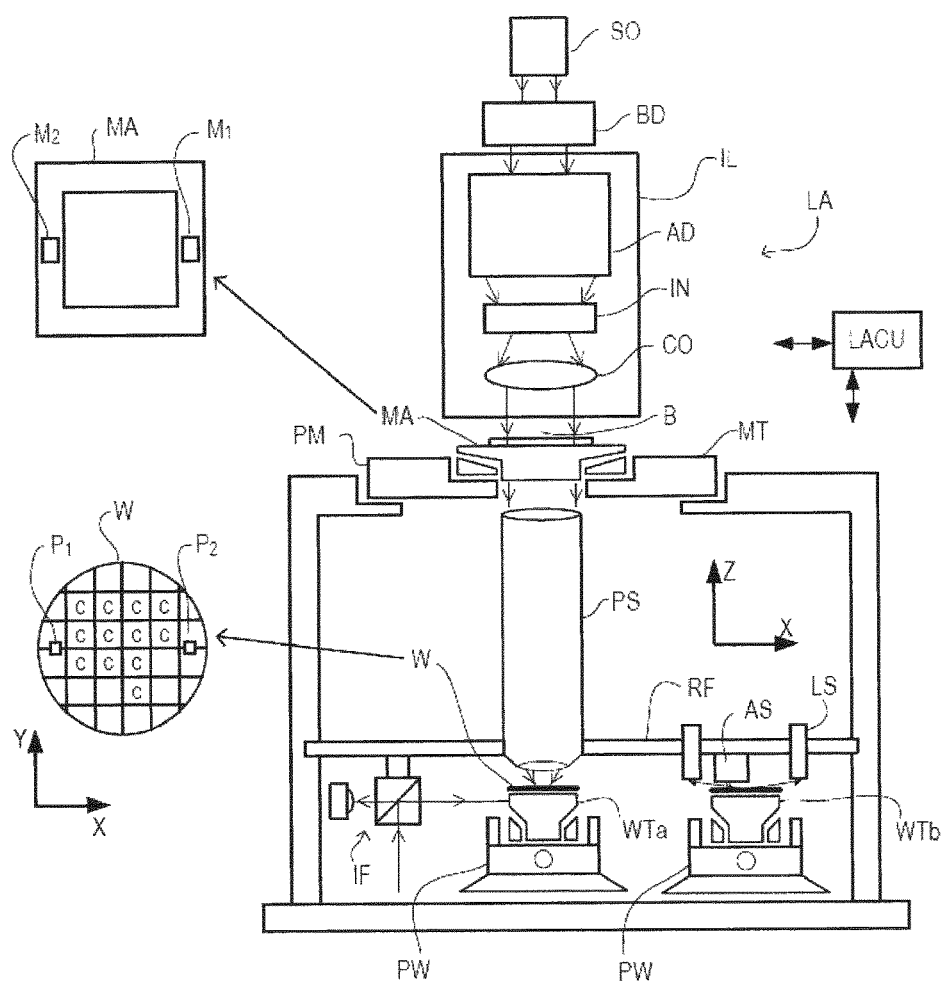
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure or patterning device support (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. Embodiments of the invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit or central processor, communicating with these sub-systems processing units, with operators and with other apparatuses involved in the lithographic manufacturing process.

FIG. 2(a) shows examples of alignment marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al) although an embodiment of the present invention is applicable to other types of alignment marks and sensors as well. FIG. 2(b) shows a modified mark for use with a similar alignment system, which X- and Y-positions can be obtained through a single optical scan with the illumination spot 206. The mark 210 has bars arranged at 45 degrees to both the X- and Y-axes. This combined X- and Y-measurement can be performed using the techniques described in U.S. Pat. No. 8,208,121 (Bijnen et al), the contents of which are incorporated herein by reference.

When transferring a first pattern to a substrate, said first pattern may include at least N alignment marks, for instance an alignment mark according to FIG. 2(a) or 2(b), wherein each alignment mark is positioned at a respective predefined nominal position in the first pattern. Usually, the substrate is subsequently processed in one or more processing devices as a result of which the substrate may be deformed. The deformation of the substrate may be repeatable depending on the processing device or even the process chamber of the processing device that is used for processing. Processing may include etching, polishing, rinsing, doping, etc of the substrate. Not all processing devices impart a deformation to the substrate. Hence, it is possible that only one processing device is responsible for nearly all or all deformation of the substrate. However, it is also possible that several processing devices have a contribution to a total deformation of the substrate. The lithographic apparatus used to transfer patterns to the substrate, see FIG. 1, may also be considered to be a processing device in the context of this application and thus may also cause a deformation of the substrate after transferring of the first pattern to the substrate.

When the deformation is repeatable, there exists a deformation pattern of the substrate that is characteristic for processing of the substrate in said one or more processing devices. By determining the deformation pattern, the determined deformation pattern may act as a template or fingerprint of said processing by the one or more processing devices. The deformation pattern may be determined using one or more calibration substrates, the deformation of which is accurately measured.

The deformation pattern may be stored in a control unit, which control unit may be part of the lithographic apparatus control unit LACU of FIG. 1. To store the deformation pattern, the control unit may comprise a dedicated storage location.

An example of a deformation pattern is shown in FIG. 3. FIG. 3 depicts an outline of an undeformed substrate W. The deformation pattern of the substrate is in this case formed by a set of pattern displacements indicated by vectors V on the substrate W, where only a few vectors are indicated by reference symbol V. Each vector V indicates the local deformation of the substrate in a direction and with a magnitude relative to other vectors, where the magnitude of the local deformation is proportional to the length of the respective vector. The deformation pattern in the example of FIG. 3 comprises two adjacent vortices VO1 and VO2 as characteristic pattern features, where vortex VO1 has a rotational direction opposite to the rotational direction of vortex VO2. Other characteristic pattern features of the deformation pattern may also be envisaged.

After processing the substrate, the position of N alignment marks is measured using an alignment sensor AS as described above with reference to FIG. 1. Based on the measurements, an alignment mark displacement from the nominal position can be determined for each of the N alignment marks by comparing the respective nominal position of an alignment mark with the respective measured position of said alignment mark, each alignment mark displacement being representative of a respective local deformation of the substrate resulting from the processing of the substrate.

Figure 4:
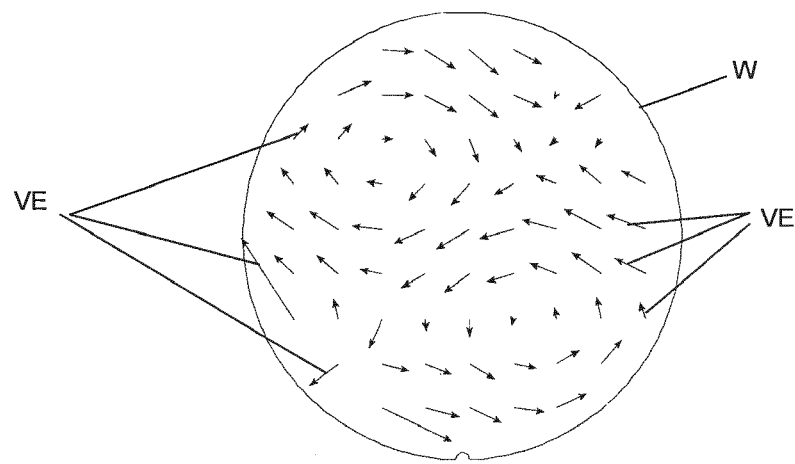
FIG. 4 depicts an example of substrate including measured alignment mark displacements, each alignment mark displacement being representative of a respective local deformation of the substrate resulting from the processing of the substrate.

An example of the N alignment mark displacements is shown with reference to FIG. 4, where an undeformed substrate W is depicted, and wherein vectors VE indicate the alignment mark displacements.

The basis of an embodiment of the invention is to determine the presence of one or more deformation patterns in the measured alignment mark displacements using a deformation pattern recognition method. To this end, a deformation pattern is fitted to the measured alignment mark displacements. By determining an accuracy value for each fitted deformation pattern indicating the accuracy of the corresponding fit and e.g. determining whether an accuracy value is above a predefined threshold, it can be determined whether the corresponding deformation pattern is present in the measured alignment mark displacements.

In practice, a deformation pattern will not 100% perfectly match with the measured alignment mark displacements. This can also be seen by comparing the deformation pattern of FIG. 3 with the measured alignment mark displacements of FIG. 4. The differences may be the result of a rotated orientation of the substrate and/or due to a difference in overall magnitude of the deformation while the mutual relationship between the vectors remains substantially the same. Differences may further be caused by measurement errors, random variations, and/or mark deformation. However, the strength of applying the deformation pattern recognition method according to the invention is that despite the differences, the deformation pattern is still easy to detect.

Figure 5:
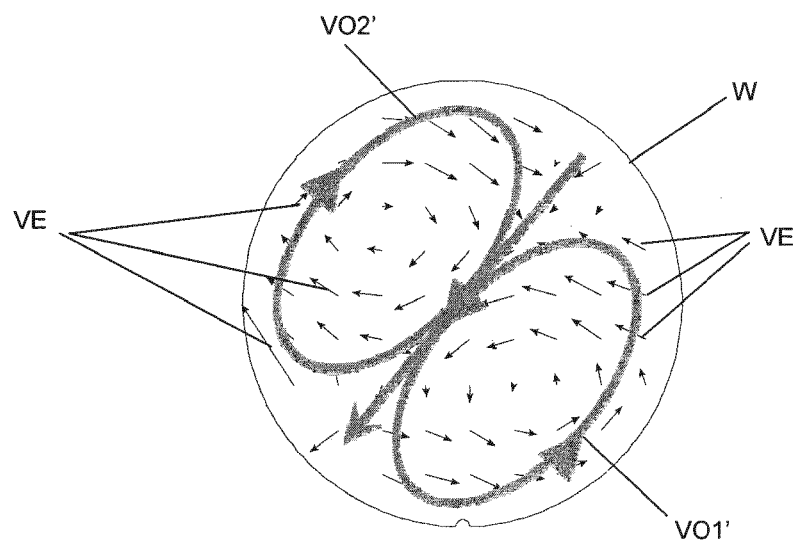
FIG. 5 depicts the measured alignment mark displacements of FIG. 4 including characteristic pattern features.

In FIG. 5 it is indicated that the measured alignment mark displacements of FIG. 4 also comprise the two adjacent vortices VO1' and VO2' as characteristic pattern features. However, the pattern present in the measured alignment mark displacements is rotated compared to the deformation pattern of FIG. 3.

Fitting the deformation pattern of FIG. 3 to the measured alignment mark displacements of FIG. 4 in this example thus involves finding the angular orientation of the deformation pattern relative to the measured alignment mark displacements in which the best match between the two patterns can be found.

The best match can for instance be found by determining the similarity between the two patterns at different angular orientations and find the maximum. In that case the similarity acts as an accuracy value used to find the best fit, i.e. to find the fit in which the accuracy value is maximal. To determine the similarity for a particular orientation, vectors of the deformation pattern and corresponding vectors of the measured alignment mark displacements may be compared with respect to each other in direction, for example in direction only to make the finding process insensitive to other parameters such as length of the vectors. The similarity in direction can be expressed by the cosine between two vectors.

Figure 6:
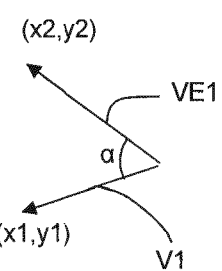
FIG. 6 depicts how an accuracy value between a pattern displacement of the deformation pattern and a measured alignment mark displacement can be determined.

FIG. 6 shows two vectors V1, VE1 that are located near each other for a particular orientation of the deformation pattern and the measured alignment mark displacements. Vector V1 is for instance a vector belonging to the deformation pattern, where vector VE1 belongs to the measured alignment mark displacements. For convenience, the origin of both vectors are positioned at the same location, although in practice, this does not have to be the case. In case vector V1 is expressed as (x1, y1) and vector VE1 is expressed as (x2, y2), the cosine of the angle α, which represents the similarity between the direction of the two vectors V1, VE1 can be expressed as:

$$\cos\alpha = \frac{x1 \cdot x2 + y1 \cdot y2}{\sqrt{(x1^2 + y1^2) \cdot (x2^2 + y2^2)}}$$

The similarity can be determined for multiple pairs of corresponding vectors and subsequently combined to yield a similarity value, i.e. accuracy value, for the particular orientation. When the similarity is determined for different angular orientations of the deformation pattern and the measured alignment mark displacements, a graph can be made in which the similarity, i.e. accuracy value, is drawn as a function of angular orientation. An example thereof is shown in FIG. 7.

Figure 7:
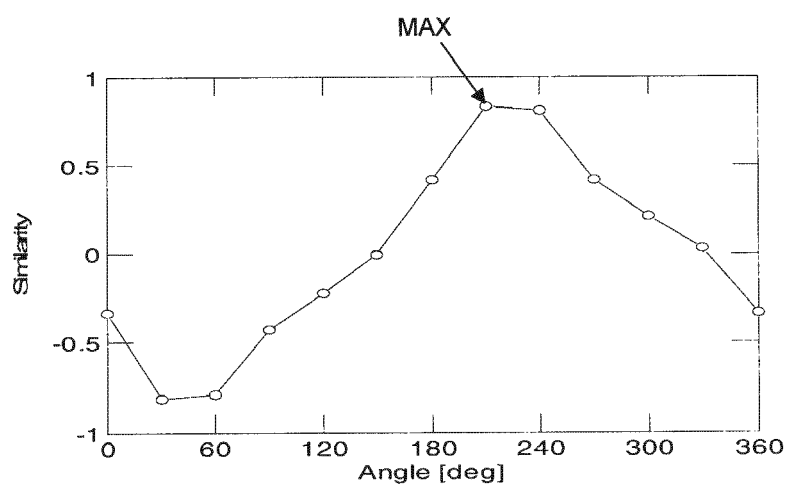
FIG. 7 depicts the determined overall accuracy value between the deformation pattern of FIG. 3 and the measured alignment mark displacements for different angular orientations of the deformation pattern.

In the example of FIG. 7, which belongs to the examples of FIGS. 3-5, the maximum similarity MAX is found for a clockwise rotation of about 210 degrees of the deformation pattern with respect to the measured alignment mark displacements.

In addition to the above fitting in orientation of the deformation pattern, the deformation pattern may also be fitted in magnitude to the measured alignment mark displacements. This can be done by comparing the sizes of corresponding vectors and finding the size of the deformation pattern that results in minimal errors between deformation pattern and measured alignment mark displacements.

It is also possible that the fitting only requires fitting in magnitude to the measured alignment mark displacements.

It is further possible that the deformation pattern is fitted to the measured alignment mark displacements in other ways than in orientation and magnitude. For instance, fitting may be done with respect to position.

In an embodiment, the deformation pattern may also be given in another form than in vector form, for instance, as a mathematical description of the deformation pattern. The measured alignment mark displacements are then also written in a similar mathematical description, so that the two mathematical descriptions can be matched relative to each other in order to fit the deformation pattern to the measured alignment mark displacements. In other words, a model is fitted to the measured alignment mark displacements and a similar model describing the deformation pattern is fitted to the fitted model.

In other words, a deformation pattern is provided in the form of a set of parameter values of a first model, wherein fitting the deformation pattern to the measured alignment mark displacements comprises:

fitting the first model to the measured alignment mark displacements to obtain parameter values corresponding to the measured alignment mark displacements; and comparing the obtained parameter values corresponding to the measured alignment mark displacements with the set of parameter values of the deformation pattern.

When multiple processing devices are used in parallel, or for instance, when a processing device has multiple processing chambers, it is possible that different deformation patterns result due to the processing. In such a case, the deformation pattern recognition method according to an embodiment of the invention can be expanded to use multiple deformation patterns each being associated with one of the possible occurring deformations of the substrate. Each of the multiple deformation patterns may then be fitted to the measured alignment mark displacements as described above with respect to the single deformation pattern of FIG. 3. By determining whether an accuracy value associated with a fit is above a predefined threshold, it can be determined whether the respective deformation pattern is present in the measured alignment mark displacements. The accuracy value may for instance be based on the similarity, see FIG. 7).

The multiple available deformation patterns may be such that only one of the multiple deformation patterns can be present in the measured alignment mark displacements at the same time. It is also possible that the deformation of the substrate may be a combination of one or more deformation patterns. Carefully choosing the threshold allows dealing with both cases. However, in case of multiple deformation patterns being present in the measured alignment mark displacements, it is desirable to fit the combination of present deformation patterns to the measured alignment mark displacements to find the contribution of each present deformation pattern to the overall deformation of the substrate.

As can be seen in FIGS. 3 and 5, the example comprises a characteristic pattern feature in the form of the presence of vortices. When using multiple deformation patterns, the multiple deformation patterns may be divided into a first subset of deformation patterns including a characteristic pattern feature and a second subset of deformation patterns lacking the characteristic pattern. In this example, the multiple deformation patterns may be divided into deformation patterns including a vortex and deformation patterns lacking the presence of a vortex. To speed up the deformation pattern recognition process, especially in case of a large number of available deformation patterns, one may first determine whether the measured alignment mark displacements comprise the characteristic pattern feature, e.g. the vortex, so that based on the outcome less deformation patterns have to be fitted to the measured alignment mark displacements, thereby reducing the required time. Hence, when the measured alignment mark displacements comprise the characteristic feature, only the first subset of deformation patterns is fitted to the measured alignment mark displacements, and when the measured alignment mark displacements lack the characteristic feature, only the second subset of deformation patterns is fitted to the measured alignment mark displacements. A subset may comprise one or more deformation patterns.

For example, the deformation pattern of FIG. 3 comprises vortices as characteristic pattern feature. If there is also at least one deformation pattern available without vortices, the method may first analyze the measured alignment mark displacements for the presence of vortices to determine whether it is useful to fit the deformation pattern of FIG. 3 to the measured alignment mark displacements or not. As a result, the measured alignment mark displacements can be analyzed more quickly by only fitting the deformation patterns that are likely to be present.

When information is obtained about the presence of deformation patterns using the deformation pattern recognition method mentioned above, it is possible to use this information in different ways.

For instance, the information may be used in a processing device monitoring method, because the presence of deformation patterns in the measured alignment mark displacements may include information about which processing devices are used and/or if these processing devices are malfunctioning or not. In a simple example, the deformation pattern of FIG. 3 may relate to a specific processing device or a specific series of processing devices. As a result, when said processing device or series of processing devices is used, one expects to find the corresponding deformation pattern. When the deformation pattern is absent although the corresponding processing device was used, the absence may be an indication that the processing device is malfunctioning. This information in turn can be used to perform maintenance on the processing device. The presence or absence of a deformation pattern can be determined using the corresponding accuracy value of the respective fit. Also a change in accuracy value, which may still be above the threshold, may indicate a malfunctioning processing device or at least an upcoming malfunction. Further, the presence of a particular deformation pattern may indicate that a malfunctioning processing device was used during processing.

The information may also be used in a pattern transferring method in which a correction recipe per deformation pattern is determined to transfer a second pattern to the substrate. The correction recipe prescribes how a second pattern has to be transferred to the substrate in order to align the second pattern with respect to the first pattern taking into account the respective deformation of the substrate as a result of the processing of the substrate in the one or more processing devices.

The correction recipe may be determined very accurately based on one or more calibration substrates. In that case, the calibration substrates including the first pattern are subjected to the associated deformation pattern after which the second pattern is transferred to the calibration substrate using different correction recipes. The optimal correction recipe is then found by determining which correction recipe resulted in minimal overlay errors between the first and second pattern.

Where prior art methods fit an alignment model to the measured alignment mark displacements and determine a correction recipe based on the fitted alignment model, the pattern transferring method according to an embodiment of the invention fits the measured alignment mark displacements to one or more deformation patterns and then applies the associated correction recipe based on the fitted deformation pattern. Hence, the pattern transferring method according to an embodiment of the invention applies pattern recognition and subsequently uses the associated correction recipe which has been determined beforehand. As a result, less alignment marks are used to find the existing deformation pattern, so that the process of obtaining the right correction recipe can be faster than with prior art methods, which is beneficial for the obtainable throughput of the lithographic apparatus. Further, the presence of an outlier has minimal influence on the pattern recognition process, so that the accuracy of the correction recipe is not or minimally influenced by such random errors, and thus the overall accuracy of the manufacturing process, i.e. the amount of overlay error, is improved. With an embodiment of the invention it is even possible to determine which of the measured alignment mark displacements can be considered to be outliers as they for instance have a low similarity with the corresponding pattern displacement compared to other measured alignment mark displacements. The similarity of an individual measured mark displacement may thus for instance be below a predefined outlier threshold value. By monitoring the individual similarities, one for instance can monitor the distribution of outliers on the substrate.

Another benefit of an embodiment of the invention is that differences between deformations of subsequent substrates caused by measurement errors, random variations, and/or mark deformation have less or no influence at all on the use of the correction recipe, as the use of the correction recipe is based on the recognition of the deformation pattern and not on the individual measurement data. Hence, by using a correction on substrate level, substrate-to-substrate variations are reduced. Further, the correction will be used for the substrate that is about to be exposed by the lithographic apparatus, which is beneficial compared to a prior art method in which the correction is based on batch averaged alignment data.

It will be appreciated by the person skilled in the art that when multiple deformation patterns are present in the measured alignment mark displacements, a similar combination of correction recipes associated with the present deformation patterns has to be used when transferring the second pattern to the substrate.

The control unit LACU of FIG. 1 may be used to carry out the different methods according to embodiments of the invention, wherein the control unit comprises a storage location or medium configured to store at least one deformation pattern which is representative of a deformation of a substrate that may be caused by a processing device when said substrate is processed in said processing device, and wherein the control unit is configured:

to control the lithographic apparatus in order to transfer a first pattern to a substrate, said first pattern including at least N alignment marks, to receive data from the alignment sensor representative for a position of N alignment marks in order to determine an alignment mark displacement for each of the N alignment marks from the respective nominal position by comparing the respective nominal position of an alignment mark with the respective measured position of said alignment mark, each alignment mark displacement being representative for a respective local deformation of the substrate resulting from the processing of the substrate, to fit the at least one deformation pattern to the measured alignment mark displacements, to determine an accuracy value for each fitted deformation pattern, each accuracy value being representative of the accuracy of the corresponding fit, and to use the obtained accuracy values in order to determine whether an associated deformation pattern is present in the measured alignment mark displacements.

The control unit may also comprise a storage location or medium configured to store a correction recipe for each stored deformation pattern, each correction recipe prescribing how a pattern has to be transferred to a substrate which is deformed in accordance with the associated deformation pattern in order to compensate for the deformation of the substrate, wherein the control unit is further configured to control the lithographic apparatus using the correction recipes of the fitted deformation patterns that are present in the measured alignment mark displacements in order to align the second pattern with respect to the first pattern.

In an embodiment, the control unit is further configured to determine whether one or more processing devices were used during processing of the substrate and/or were malfunctioning during processing of the substrate by using the obtained accuracy values of the fitted deformation patterns.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A deformation pattern recognition method comprising:
   a) providing one or more deformation patterns, each deformation pattern being associated with a deformation of a substrate that may be caused by one or more processing devices when said substrate is processed by said one or more processing devices;
   b) transferring a first pattern to a substrate, said first pattern including at least N alignment marks, wherein each alignment mark is positioned at a respective predefined nominal position in the first pattern;
   c) processing the substrate by said one or more processing devices;
   d) measuring a position of the N alignment marks and determining an alignment mark displacement for each of the N alignment marks from the respective nominal position by comparing the respective nominal position of an alignment mark with the respective measured position of said alignment mark;
   e) fitting at least one of the one or more deformation patterns to the measured alignment mark displacements;
   f) determining an accuracy value for each fitted deformation pattern, the accuracy value being representative of the accuracy of the corresponding fit;
   g) using the determined accuracy value, determining whether an associated deformation pattern is present in the measured alignment mark displacements.

2. A deformation pattern recognition method according to claim 1, wherein determining whether a deformation pattern is present in the measured alignment mark displacements comprises determining whether the associated accuracy value is above or below a predefined threshold.

3. A deformation pattern recognition method according to claim 1, wherein the one or more deformation patterns are provided in the form of a set of pattern displacements associated with the N alignment marks, and wherein fitting a deformation pattern to the measured alignment mark displacements includes comparing the respective set of pattern displacements with the measured alignment mark displacements.

4. A deformation pattern recognition method according to claim 1, wherein the one or more deformation patterns are provided in the form of a set of parameter values of a first model, and wherein fitting a deformation pattern to the measured alignment mark displacements includes:

fitting the first model to the measured alignment mark displacements to obtain parameter values corresponding to the measured alignment mark displacements; and
comparing the obtained parameter values corresponding to the measured alignment mark displacements with the set of parameter values of the respective deformation pattern.

5. A deformation pattern recognition method according to claim 1, wherein the at least one deformation pattern is fitted in magnitude to the measured alignment mark displacements.

6. A deformation pattern recognition method according to claim 1, wherein the at least one deformation pattern is fitted in orientation to the measured alignment mark displacements.

7. A deformation pattern recognition method according to claim 1, wherein at least two deformation patterns are provided, wherein the at least two deformation patterns comprise a first subset of deformation patterns including a characteristic pattern feature and a second subset of deformation patterns lacking the characteristic pattern feature, wherein prior to e) the method comprises determining whether the measured alignment mark deformations comprise the characteristic pattern feature or not, wherein only the deformation patterns of the first subset are used in f) when the characteristic pattern feature is present, and wherein only the deformation patterns of the second subset are used in f) when the characteristic pattern feature is absent.

8. A pattern transferring method comprising:
   1) providing a correction recipe for each of the one or more deformation patterns, each correction recipe prescribing how a pattern has to be transferred to a substrate deformed in accordance with the associated deformation pattern in order to compensate for the deformation of the substrate;
   2) carrying out the method steps of the deformation pattern recognition method according to claim 1 to determine which of the one or more deformation patterns are present in the measured alignment mark displacements;
   3) transferring a second pattern to the substrate using the correction recipes of the fitted deformation patterns that are present in the measured alignment mark displacements in order to align the second pattern with respect to the first pattern.

9. A pattern transferring method according to claim 8, wherein a correction recipe for an associated deformation pattern is determined by carrying out:
   4) subjecting one or more substrates including the first pattern to the associated deformation pattern;
   5) transferring the second pattern to the one or more substrates using different correction recipes; and
   6) choosing the correction recipe that results in minimal overlay errors between the first and second pattern.

10. A pattern transferring method according to claim 9, wherein the correction recipe is varied until the correction recipe is found that results in minimal overlay errors between the first and second pattern.

11. A processing device monitoring method comprising:
    1) carrying out the method steps of the deformation pattern recognition method according to claim 1 to determine which of the one or more deformation patterns is present in the measured alignment mark displacements; and
    2) using the obtained accuracy values of the fitted deformation patterns in order to determine whether the corresponding one or more processing devices were used during processing of the substrate and/or were malfunctioning during processing of the substrate.

12. A lithographic apparatus arranged to transfer a pattern from a patterning device onto a substrate, the apparatus comprising:
- a substrate table constructed to hold a substrate;
- an alignment sensor configured to measure the positions of alignment marks on the substrate relative to a reference;
- a control unit configured to control the transfer onto the substrate by reference to the positions of the alignment marks on the substrate measured by said alignment sensor;
- wherein the control unit comprises a storage medium configured to store at least one deformation pattern which is representative of a deformation of a substrate that may be caused by a processing device when said substrate is processed by said processing device, and wherein the control unit is configured:
- to control the lithographic apparatus in order to transfer a first pattern to a substrate,
- said first pattern including at least N alignment marks,
- to receive data from the alignment sensor representative for a position of the N alignment marks in order to determine an alignment mark displacement for each of the N alignment marks from the respective nominal position by comparing the respective nominal position of an alignment mark with the respective measured position of said alignment mark, each alignment mark displacement being representative of a respective local deformation of the substrate resulting from the processing of the substrate,
- to fit the at least one deformation pattern to the measured alignment mark displacements,
- to determine an accuracy value for each fitted deformation pattern, each accuracy value being representative for the accuracy of the corresponding fit, and
- to use the obtained accuracy values in order to determine whether an associated deformation pattern is present in the measured alignment mark displacements.

13. A lithographic apparatus according to claim 12, wherein the control unit comprises a storage medium configured to store a correction recipe for each stored deformation pattern, each correction recipe prescribing how a pattern has to be transferred to a substrate which is deformed in accordance with the associated deformation pattern in order to compensate for the deformation of the substrate, and wherein the control unit is further configured to control the lithographic apparatus using the correction recipes of the fitted deformation patterns that are present in the measured alignment mark displacements in order to align the second pattern with respect to the first pattern.

14. A lithographic apparatus according to claim 12, wherein the control unit is further configured to determine whether one or more processing devices were used during processing of the substrate and/or were malfunctioning during processing of the substrate by using the obtained accuracy values of the fitted deformation patterns.

* * * * *